United States Patent
Van Veldhoven

(10) Patent No.: US 8,242,840 B2
(45) Date of Patent: Aug. 14, 2012

(54) CAPACITIVE SENSOR

(75) Inventor: Robert Hendrikus Margaretha Van Veldhoven, Dommelen (NL)

(73) Assignee: NXP B.V., Eindhoven (NL)

( * ) Notice: Subject to any disclaimer, the term of this patent is extended or adjusted under 35 U.S.C. 154(b) by 29 days.

(21) Appl. No.: 12/905,677

(22) Filed: Oct. 15, 2010

(65) Prior Publication Data

US 2011/0090009 A1 Apr. 21, 2011

(30) Foreign Application Priority Data

Oct. 16, 2009 (EP) .................................. 09252438

(51) Int. Cl.
*H03F 1/14* (2006.01)
(52) U.S. Cl. .................... 330/174; 381/121; 330/292
(58) Field of Classification Search .............. 330/112, 330/174, 292; 381/121, 122
See application file for complete search history.

(56) References Cited

U.S. PATENT DOCUMENTS

| 5,675,296 A | 10/1997 | Tomikawa |
| 7,509,856 B1 * | 3/2009 | Winkens et al. ............ 73/304 C |
| 2008/0025531 A1 | 1/2008 | Suzuki et al. |
| 2009/0086992 A1 | 4/2009 | Hsu et al. |

FOREIGN PATENT DOCUMENTS

| DE | 196 00 689 A1 | 7/1996 |
| EP | 1 739 826 A1 | 1/2007 |
| WO | 94/23547 A1 | 10/1994 |

OTHER PUBLICATIONS

Extended European Search Report for Patent Appln. No. 09252438.8 (Feb. 18, 2010).

* cited by examiner

*Primary Examiner* — Steven J Mottola

(57) ABSTRACT

A capacitive sensor amplifier circuit comprising: a capacitive sensor; a bias voltage supply connected across the capacitive sensor via a bias resistor; an operational amplifier having an input connected to the capacitive sensor; and a feedback capacitor connected between the input and an output of the amplifier, the input and output being of the same sign.

8 Claims, 2 Drawing Sheets

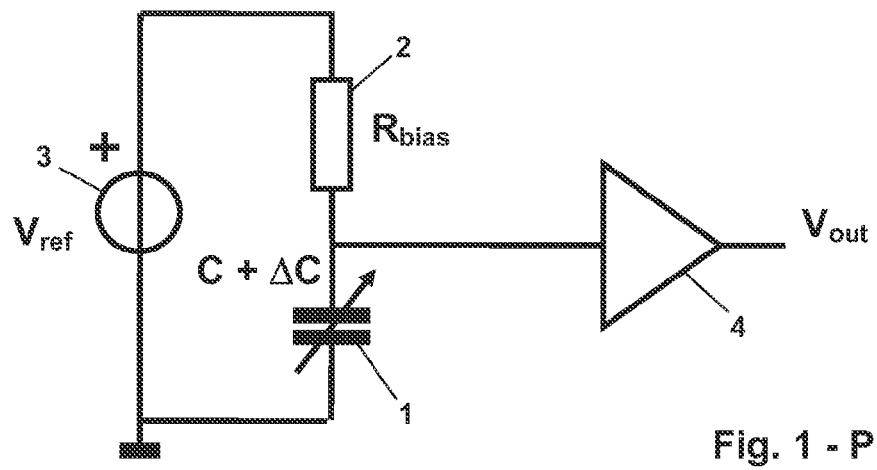
Fig. 1 - Prior Art
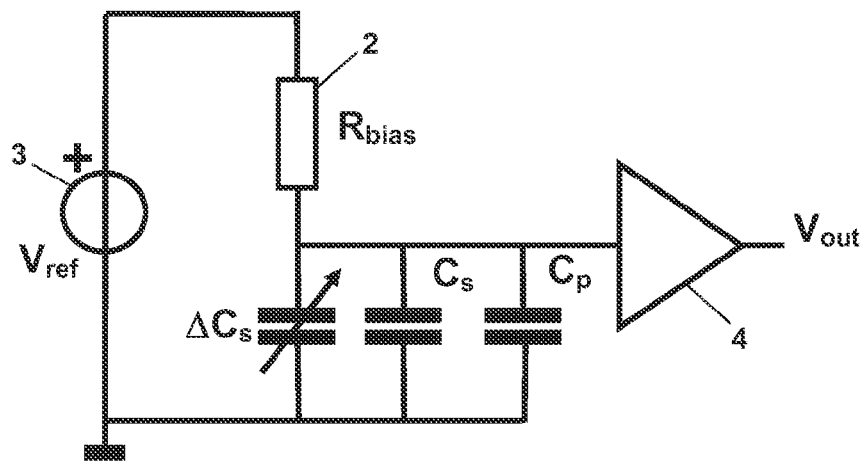
Fig. 2 - Prior Art

CAPACITIVE SENSOR

CROSS-REFERENCE TO RELATED APPLICATION

This application claims the priority under 35 U.S.C. §119 of European patent application no. 09252438.8, filed on Oct. 16, 2009, the contents of which are incorporated by reference herein.

The invention relates to amplification of signals from capacitive sensors.

BACKGROUND OF THE INVENTION

Field of the Invention

Capacitive sensors such as capacitor-type microphones respond to received signals by a change in capacitance. This change in capacitance can be transformed into a voltage signal by applying a bias voltage across the capacitive element of the sensor and amplifying a voltage variation across the capacitive element resulting from the received signal.

The schematic circuit diagram in FIG. 1 illustrates a common way of biasing a capacitive microphone 1 having a static capacitance value C by use of a bias resistor 2 ($R_{bias}$) connected in series with a DC reference voltage 3 ($V_{ref}$). The value of the bias resistor 2 is chosen such that the cut-off frequency of the sensor and bias resistor combination (determined by the inverse of the time constant of $R_{bias}C$) is well below the frequency band of interest, in this case the audio band. The capacitor is charged to the bias voltage $V_{ref}$ and, although the capacitance value changes ($\Delta C$) according to varying sound pressure exciting the microphone, very little current leaks out of the capacitor 1 due to the high value of $R_{bias}$ (which is typically of the order of 100 MΩ or higher). The actual charge on the capacitor 1 (given by Q=VC) therefore stays almost constant, meaning that the output voltage of the microphone changes as a function of the incoming sound pressure level. An amplifier 4 is connected to the capacitor 1 to amplify this output voltage signal to provide an amplified output signal $V_{out}$.

A problem with the conventional biasing scheme shown in FIG. 1 is its sensitivity to parasitic capacitances at the output of the microphone. An illustration of this is shown in the schematic circuit diagram of FIG. 2, in which the microphone capacitance is shown divided into a constant part $C_s$ and a varying part $\Delta C_s$, with an additional parasitic capacitance given by a further parallel capacitance value $C_p$. In typical microphones the varying part of the capacitance $\Delta C_s$ is very small compared to its fixed part $C_s$. This results in a smaller output voltage change at the output of the microphone, as charge redistribution takes place in a larger capacitance (V=Q/C). Moreover, as the connection between the microphone output and associated electronics tend not to be on the same chip or circuit board, any parasitic capacitance at the connection of the microphone to the amplifier 4 also reduces this sensitivity. The input capacitance of the amplifier 4 connected to the output of the microphone reduces sensitivity even further (for simplicity this can be assumed to be also included in the parasitic capacitance $C_p$ shown in FIG. 2). This results in the following relationship for the voltage signal $\Delta V_1$ input to the amplifier 4:

$$\Delta V_1 = \frac{\Delta C_s \cdot V_{ref}}{\Delta C_s + C_s + C_p} \quad \text{(equation 1)}$$

The magnitude of the voltage signal $\Delta V_1$ is therefore reduced according to the magnitude of the static capacitance $C_s$ of the capacitive sensor and by the total magnitude $C_p$ of any parasitic capacitances. This results in a reduced sensitivity, which will need to be compensated for by increasing the amplification factor of the amplifier 4, which can result in increased noise.

It is an object of the invention to address the above mentioned problem.

BRIEF SUMMARY OF THE INVENTION

In accordance with the invention there is provided a capacitive sensor amplifier circuit comprising:
- a capacitive sensor;
- a bias voltage supply connected across the capacitive sensor via a bias resistor;
- an operational amplifier having an input connected to the capacitive sensor; and
- a feedback capacitor connected between the input and an output of the amplifier, the input and output being of the same sign.

An advantage of the invention is that the feedback capacitor is connected across the amplifier such that it effectively counteracts or cancels part of the static capacitance of the capacitive sensor and any parasitic capacitance at the input of the amplifier. The sensitivity of the sensor is thereby increased.

A value $C_f$ of the feedback capacitor can be selected such that $(A-1)C_f$ is within 10%, but is not equal to, a capacitance value given by $C_s+C_p$, where A is an amplification factor of the amplifier, $C_s$ is a static capacitance value of the capacitive sensor and $C_p$ is a sum total of parasitic capacitances at the input of the amplifier.

In certain embodiments, the value of $(A-1)C_f$ is equal or greater than 0.9 $(C_s+C_p)$ while being less than $C_s+C_p$.

An advantage of selecting the value of the feedback capacitor in this way is that the sensitivity of the sensor is maximised according to the value of the capacitance of the sensor and any associated parasitic capacitances. This also reduces the need to minimise parasitic capacitances, since the feedback capacitor can be chosen to counteract these, allowing a circuit design more flexibility.

In preferred embodiments, the input and output of the amplifier are both non-inverting. In alternative embodiments, the input and output are both inverting.

The invention is particularly suitable for the capacitive sensor capacitive sensor being an acoustic sensor, but may also be applied to other types of capacitive sensors.

BRIEF DESCRIPTION OF THE DRAWING

The invention is described in further detail below by way of example, with reference to the appended drawings in which:

FIG. 1 is a schematic circuit diagram of a known type of capacitive sensor amplifier circuit;

FIG. 2 is an alternative schematic circuit diagram of the circuit of FIG. 1.

DETAILED DESCRIPTION OF THE INVENTION

Figure 3:
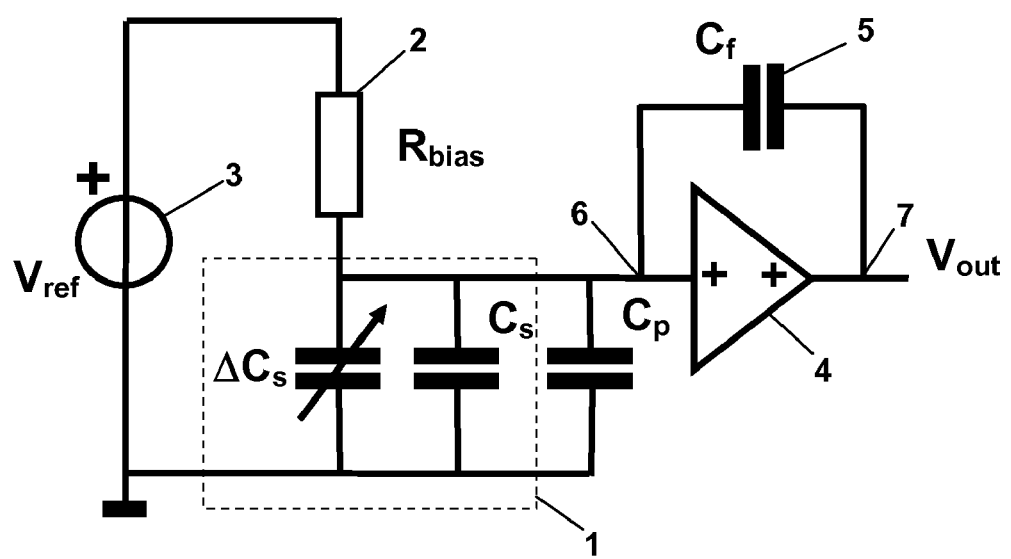
FIG. 3 is a schematic circuit diagram of a capacitive sensor amplifier circuit according to an embodiment of the invention.

FIGS. 1 and 2 have already been described above in the background to the invention.

An embodiment of the invention is illustrated in the schematic circuit diagram in FIG. 3. A feedback capacitor 5 ($C_f$) is connected across the amplifier, using positive feedback, i.e. one plate of the feedback capacitor is connected to the non-inverting input 6 of the amplifier 4 and the other plate is connected to the non-inverting output 7 of the amplifier 4. In alternative embodiments, the feedback capacitor may be connected between an inverting input of the amplifier and an inverting output of the amplifier. In a general aspect therefore, the feedback capacitor is connected between an input and an output of the amplifier where the input and output are of the same sign.

Other known arrangements in which a capacitor is provided in a feedback loop across an operational amplifier for amplifying signals from a capacitive sensor are known, such as disclosed in US applications 2008/025531 and 2009/086992. Such arrangements, in which the feedback capacitor is connected between an inverting input and a non-inverting output of the amplifier, do not result in the cancellation property of the present invention, as described below.

By using a positive feedback loop, part of the output voltage signal $V_{out}$ is fed back to the capacitive sensor 1. The amplifier 4 operates like a Miller-type operational amplifier, but with positive feedback. The combination of the amplifier 4 and feedback capacitor 5 results in an effective negative capacitance at the input 6 of the amplifier 4. This negative capacitance therefore is subtracted from the static and parasitic capacitances $C_s$, $C_p$ at the amplifier input 6. The voltage signal $\Delta V_2$ at the amplifier input 6 is consequently boosted, according to the following relationship:

$$\Delta V_2 = \frac{\Delta C_s \cdot V_{ref}}{\Delta C_s + C_s + C_p - (A-1)C_f} \quad \text{(equation 2)}$$

where A is the amplification factor of the amplifier 4.

Equation 2 above shows that the result of adding capacitive positive feedback to the amplifier is that when $(A-1)C_f$ is slightly smaller or larger than $C_s+C_p$, the output signal $\Delta V_2$ can be increased substantially. However, when $(A-1)C_f$ is exactly equal to $C_s+C_p$ the output signal $\Delta V_2$ reduces to zero, which is of course unwanted. The value of $C_f$ should therefore be selected such that $(A-1)C_f$ is close to, but not equal to, the sum of the static capacitance of the capacitive sensor and any parasitic capacitances. In practical embodiments, $(A-1)C_f$ is preferably within 10%, i.e. is no more than 110% and no less than 90%, of $C_s+C_p$. In certain embodiments, $(A-1)C_f$ is equal to or greater than 0.9 $(C_s+C_p)$ but is less than $C_s+C_p$, or alternatively is equal to or less than 1.1 $(C_s+C_p)$ but is greater than $C_s+C_p$. One way of ensuring that this range is maintained is by selecting the value of $C_f$ such that a total spread of expected values for $(A-1)C_f$, taking into account known statistical variations, remains within the above ranges, for example by selecting $C_f$ such that a 6σ spread of values for $(A-1)C_f$ remains within the range between 0.9 $(C_s+C_p)$ and $C_s+C_p$ or between 1.1 $(C_s+C_p)$ and $C_s+C_p$.

The following equation shows the improvement, $G_{boost}$, of the signal $\Delta V$ at the amplifier input 6, by comparing the value of $\Delta V_1$ from equation 1 with $\Delta V_2$ from equation 2:

$$G_{boost} = \frac{\Delta V_1}{\Delta V_2} = \frac{\Delta C_s + C_s + C_p}{\Delta C_s + C_s + C_p - (A-1)C_f} \quad \text{(equation 3)}$$

Because this signal boosting results in a larger magnitude of signal at the microphone output and amplifier input 6, the signal becomes much more robust to interference. Examples of interference sources include switched mode voltage supplies, ground plane interference and electromagnetic interference.

The signal boosting technique of the invention is not necessarily limited to only microphones, but can also be used for other types of capacitive sensors, examples including pressure sensors, ultrasound sensors (including ultrasound sensor arrays), distance sensors and accelerometers.

Other embodiments are also within the scope of the invention, as defined by the appended claims.

The invention claimed is:

1. A capacitive sensor amplifier circuit comprising:
   a capacitive sensor;
   a bias voltage supply connected across the capacitive sensor via a bias resistor;
   an operational amplifier having an input connected to the capacitive sensor; and
   a feedback capacitor connected between the input and an output of the amplifier, the input and the output being of a same sign,
   wherein a value $C_f$ of the feedback capacitor is selected such that $(A-1)C_f$ is within 10% of, but is not equal to, a capacitance value given by $C_s+C_p$, where A is an amplification factor of the amplifier, $C_s$ is a static capacitance value of the capacitive sensor and $C_p$ is a sum total of parasitic capacitances at the input of the amplifier.

2. The capacitive sensor amplifier circuit of claim 1 wherein the value of the feedback capacitor is selected such that 0.9 $(C_s+C_p) \leq (A-1)C_f < C_s+C_p$.

3. The capacitive sensor amplifier circuit of claim 1 wherein the input is a non-inverting input.

4. The capacitive sensor amplifier circuit of claim 1 wherein the capacitive sensor is an acoustic sensor.

5. A capacitive sensor amplifier circuit comprising:
   a capacitive sensor;
   a bias voltage supply connected across the capacitive sensor via a bias resistor;
   an operational amplifier having an input connected to the capacitive sensor; and
   a feedback capacitor connected between the input and an output of the amplifier, the input and the output being of a same sign, the capacitive sensor being characterized in that a value $C_f$ of the feedback capacitor is selected such that $(A-1)C_f$ is within 10% of, but is not equal to, a capacitance value given by $C_s+C_p$, where A is an amplification factor of the amplifier, $C_s$ is a static capacitance value of the capacitive sensor and $C_p$ is a sum total of parasitic capacitances at the input of the amplifier.

6. The capacitive sensor amplifier circuit of claim 5, wherein the value of the feedback capacitor is selected such that 0.9 $(C_s+C_p) \leq (A-1)C_f < C_s+C_p$.

7. The capacitive sensor amplifier circuit of claim 5, wherein the input is a non-inverting input.

8. The capacitive sensor amplifier circuit of claim 5, wherein the capacitive sensor is an acoustic sensor.

* * * * *